United States Patent [19]

Cronin et al.

[11] Patent Number: 4,758,306

[45] Date of Patent: Jul. 19, 1988

[54] STUD FORMATION METHOD OPTIMIZING INSULATOR GAP-FILL AND METAL HOLE-FILL

[75] Inventors: John E. Cronin, Milton; Carter W. Kaanta, Colchester, both of Vt.

[73] Assignee: International Business Machines Corporation, Armonk, N.Y.

[21] Appl. No.: 86,120

[22] Filed: Aug. 17, 1987

[51] Int. Cl.[4] .................. B44C 1/22; C03C 15/00; C03C 25/06; C23F 1/02
[52] U.S. Cl. .................... 156/643; 156/645; 156/646; 156/651; 156/652; 156/653; 156/656; 156/657; 156/659.1; 204/192.32; 357/49; 357/67; 437/228; 437/198; 437/199
[58] Field of Search ............... 156/643, 644, 645, 646, 156/651, 652, 653, 656, 657, 659.1, 661.1, 662; 204/192.32, 192.37; 437/187, 189, 197–199, 203, 228; 252/79.1; 357/49, 67, 65

[56] References Cited

U.S. PATENT DOCUMENTS

| | | | |
|---|---|---|---|
| 4,307,179 | 12/1981 | Chang et al. | 156/656 X |
| 4,572,765 | 2/1986 | Berry | 156/653 X |
| 4,575,402 | 3/1986 | Marcoux et al. | 156/643 |
| 4,595,452 | 6/1986 | Landau et al. | 156/643 |
| 4,597,826 | 7/1986 | Majima et al. | 156/643 |

*Primary Examiner*—William A. Powell
*Attorney, Agent, or Firm*—Mark F. Chadurjian

[57] ABSTRACT

A method of forming a conductive structure on a substrate by using both of the via-filling and stud-forming metallization techniques. A stud that is approximately one-half the thickness of the final stud is defined on a conductive layer. The stud-forming mask is left in place. Then the sidewalls of the mask are positively tapered, and an insulator layer is deposited on the substrate. The insulator is then etched to expose the stud forming mask, and the mask is removed. The sidewalls of the vias thus defined in the insulator layer are then positively tapered. By positively tapering both the stud mask prior to insulator deposition and the insulator via prior to metal deposition, insulator gap-fill and metal hole-fill problems are eliminated.

9 Claims, 2 Drawing Sheets

STUD FORMATION METHOD OPTIMIZING INSULATOR GAP-FILL AND METAL HOLE-FILL

CROSS-REFERENCE TO RELATED APPLICATIONS

Reference is made to co-pending U.S. patent application Ser. No. 791,860, entitled "Chem-Mech Polishing Method for Producing Co-Planar Metal/Insulator Films on a Substrate," filed Oct. 28, 1985, by Beyer et al and assigned to the assignee of the present invention. This patent application relates to a method for producing co-planar metal/insulator films on a substrate according to a chemical-mechanical (chem-mech) polishing technique utilizing an improved polishing slurry. The invention is particularly directed to the fabrication of the planarized multi-level metal semiconductor structures.

Reference is also made to co-pending U.S. patent application Ser. No. 927,623, entitled "Polyimide Stud Transfer Process," filed Nov. 6, 1986, by Chaloux, Jr., et al and assigned to the assignee of the present invention. The application relates to a method for forming a mask, covering the mask with a thick oxide layer, planarizing the oxide layer to expose the underlaying mask, and removing the mask to subsequently define conductive structures in the planarized oxide layer.

TECHNICAL FIELD

The present invention relates to a metallization process for interconnecting discrete devices to form an integrated circuit.

BACKGROUND ART

In general, two distinct stud metallurgical technologies are known in the semiconductor fabrication industry. One technology involves depositing a layer of doped glass such as borophosphosilicate glass (BPSG) or phosphosilicate glass (PSG) on a processed substrate, etching vias through the doped glass layer so as to expose selected structures on the substrate, and filling these vias with metal to define conductive studs that interconnect the underlying structures through the overlying metal. The other technology involves depositing a metal layer directly on the processed substrate, patterning the metal to define the conductive studs, depositing the doped glass layer, and planarizing the glass layer to expose the upper surfaces of the conductive studs.

As the density of integrated circuits increases, the space taken up by a metal line plus the spacing between lines decreases (in the art, this is referred to as a "tight" metal pitch). Both of the above-mentioned stud metallization techniques become more difficult to implement at a tighter metal pitch. These difficulties are illustrated in FIGS. 1 and 2 (Prior Art). As shown in FIG. 1, when vias 2 are formed in a layer of doped glass 4 deposited on a substrate 1 prior to metal deposition, the high metal pitch necessitates the use of vias having vertical sidewall slopes. Moreover, the width of the vias must decrease. The resulting vias have a high "aspect ratio" (i.e., the ratio of the depth to the width W of the via), As is well known in the art, it is very difficult to deposit a layer of metal within a via having a high aspect ratio without forming voids in the metal and, hence, decreasing the conductivity/reliability of the metal within the via. This the so-called "metal hole-fill" problem. As shown in FIG. 2, a similar aspect ratio problem is presented when the doped glass layer is to be deposited on a substrate 1 having closely spaced conductive studs 6 disposed thereon. Again, it will be difficult to deposit a void-free doped glass in the high aspect ratio "gap" between the two studs 6. This is the so-called "insulator gap-fill" problem.

In the prior art, the metal hole-fill problem has been addressed by chamfering the vertical via sidewalls prior to metal deposition. See, e.g. U.S. Pat. No. 4,595,452, entitled, "Method And Apparatus For Plasma Etching," issued June 17, 1986 to Landau et al and assigned to Oerlikon-Buhrle U.S.A. However, for various reasons (e.g., maintenance of device planarity) it would be advantageous to utilize the metallization technology in which the studs are defined prior to insulator deposition. Simply chamfering the metal studs prior to insulator deposition is not a satisfactory solution to the insulator gap-fill problem in that the attendant change in the metal profile may substantially degrade its conductivity characteristics.

Accordingly, a need exists in the art for a metallization process that addresses the insulator gap-fill problem without etching the metal after stud definition.

SUMMARY OF THE INVENTION

Thus, it is an object of the present invention to provide a metallization process that maximizes insulator gap-fill.

It is another object of the invention to provide a metallization process that addresses insulator gap-fill without etching the conductive studs.

It is yet another object of the invention to provide a metallization process that utilizes the beneficial properties of both of the via-filling and stud-definition metallization technologies, while addressing the metal hole-fill and insulator gap-fill problems presented by each.

These and other aspects of the invention are realized by a method of forming a conductive structure on a substrate by using both of the via-filling and stud-forming metallization techniques. A stud that is approximately one-half the thickness of the final stud is defined on a substrate. The stud-forming mask is left in place. Then the sidewalls of the mask are positively tapered, and an insulator layer is deposited on the substrate. The insulator is then etched to expose the stud forming mask, and the mask is removed. The sidewalls of the vias thus defined in the insulator layer are then positively tapered. By positively tapering both the stud mask prior to insulator deposition and the insulator via prior to metal deposition, insulator gap-fill and metal hole-fill problems are eliminated.

BRIEF DESCRIPTION OF THE DRAWING

The above and other stuctures and teachings of the invention will become more apparent upon a description of the best mode as rendered below. In the description to follow, reference will be made to the accompanying drawing, in which.

DESCRIPTION OF THE BEST MODE FOR CARRYING OUT THE INVENTION

Figure 1:
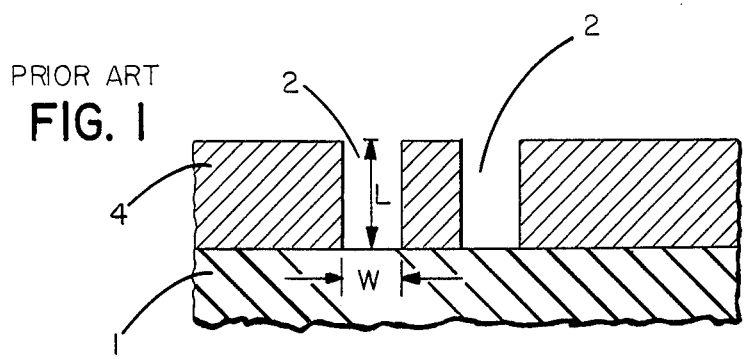
FIGS. 1 and 2 (Prior Art) are cross-sectional views illustrating the metal hole-fill and insulator gap-fill problems, respectively, of the prior art.
Figure 2:
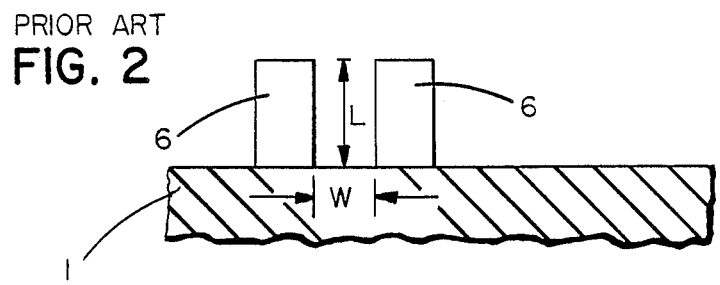
Figure 3:
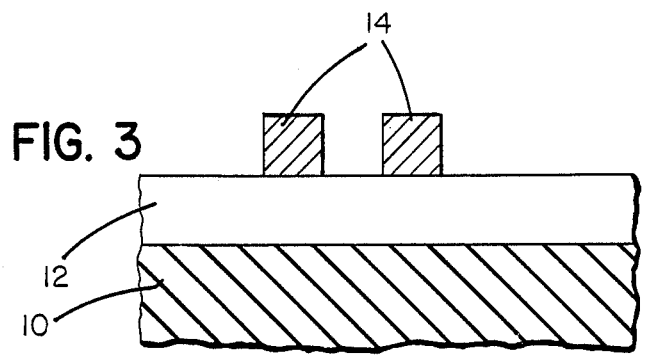
FIGS. 3-6 are cross-sectional views of a substrate undergoing the process steps according to a first embodiment of the invention.

With reference to FIG. 3, a layer of blanket metal 12 is deposited on a substrate 10. For purposes of illustration, substrate 10 is shown as being devoid of integrated circuit structures. In practice, however, many devices (resistors, capacitors, transistors, etc.) are formed on the substrate prior to metal definition. The conductive studs to be formed will be used to interconnect these elements to form an integrated circuit. The metal layer 12 may be made of a conventional aluminum-based metallurgy CAl/2%Si, Al/4%Cu/2% Si) evaporated onto the surface of substrate 10 using conventional techniques to a thickness of approximately one-half the final stud height (e.g., one micron). Other metals (e.g., refractory metals such as tungsten) could also be used.

A stud mask structure 14 is then defined on the blanket conductive layer 12. The stud mask 14 is made of a material (e.g. silicon nitride) that can be removed without appreciably attacking doped silicon oxide. The silicon nitirde is deposited using conventional low pressure (0.2 mTorr) chemical vapor deposition techniques (LPCVD) with silane and ammonia as the deposition sources. The silicon nitride layer should also be approximately one-half the final metal stud height (again, approximately one micron). A conventional photosensitive polymer (e.g., a novolac-based photoresist such as AZ 1350J available from the AZ Photoresist Products Group of American Hoechst Corporation, Somerville, NJ—"AZ" is a trademark of American Hoechst Corporation) is then deposited and patterned to define a resist mask, and exposed portions of the silicon nitride layer are anisotropically removed by exposure to a directional $CHF_3/O_2$ gaseous plasma reactive ion etch (RIE).

Figure 4:
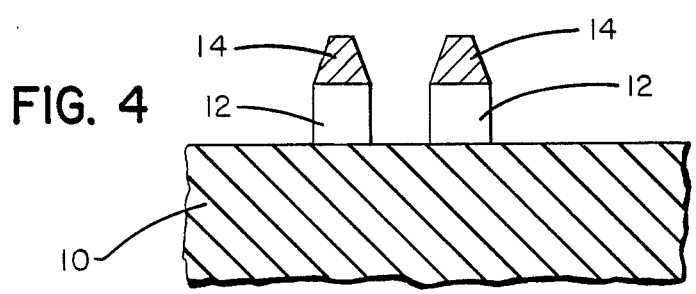

As shown in FIG. 4, the substrate is then subjected to a further RIE that removes portions of the metal layer 12 exposed by the stud mask 14 without appreciably attacking underlying portions of the substrate 10. The RIE can be carried out in a chlorine-based gaseous plasma such as the $BCl_3/Cl_2/CHCl_3/N_2$ combination used in Plasmatherm Single Wafer metal etch tools.

The substrate is then subjected to a sputter etch that positively tapers the sidewalls of the stud mask 14. The actual slope of the tapered sidewalls can be controlled by introducing a small amount of $CF_4$ to a Ar-based sputter etch (2000 watts, −450 V DC bias, 0.02 Torr). In general, a positive 60° taper will provide the optimum tradeoff between sidewall sloping and maximum mask area at the upper surface of the mask. By "positive" taper we mean that the sidewalls should slope inwardly, as generally shown in FIG. 4. The etch should be continued until the stud mask 14 has achieved the desired positive sidewall slope. The sputter etch step should be stopped before the underlaying metal studs are appreciably attacked. Other physical-type etching processes (e.g., ion milling) could be used instead of sputtering.

A thick passivation layer 16 is then applied to the substrate, and is planarized back to expose the upper surfaces of the stud masks 14. The insulating layer may be undoped glass, doped glass (BPSG, PSG), or any other thick insulator (e.g., polyimide) that provide protection against charge penetration as well as insulation between metal levels. Doped glass (particularly BPSG) is preferred. Note that because of the taper of the stud mask, the aspect ratio of the gap between adjacent studs decreases, such that the glass may be deposited with a substantially reduced threat of producing voids. That is, because of tapering, the portion of the gap having vertical sidewalls decreases by a factor of two. After the insulator is deposited using conventional techniques, it is planarized so as to facilitate the deposition of subsequent metal levels while exposing the stud mask. While there are other known techniques (e.g. deposition of a planarizing polymer layer and then etching the polymer layer in a gaseous plasma that etches the underlying doped glass at substantially the same rate) to accomplish this result, the inventors prefer polishing the doped glass surface using a Strasbaugh wafer polish tool having a SUBA4 perforated polishing pad at a pressure of 8 psi in the presence of an abrasive slurry (e.g., "Cabot SC01" available from Cabot Corp.). The polish should be continued until the upper surface of the stud masks 14 are exposed, without removing an appreciable portion of the masks.

Figure 5:
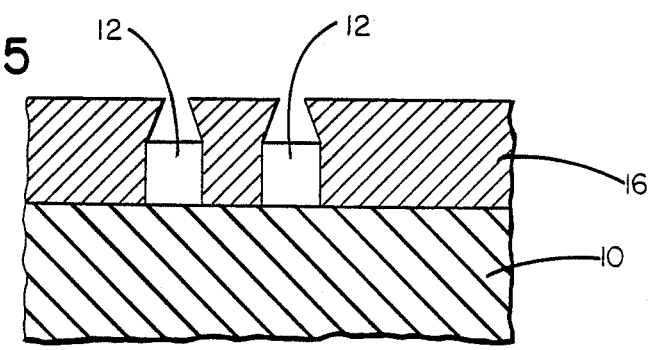
Figure 6:
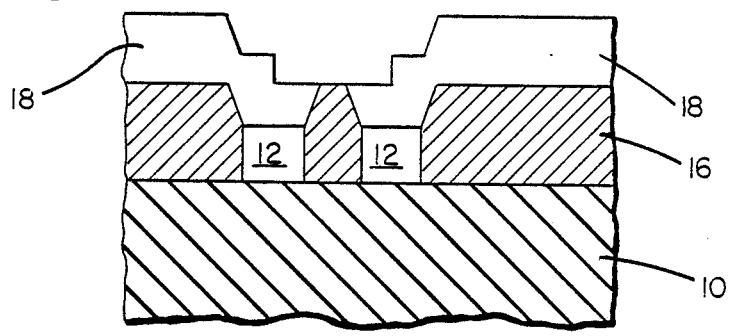

The stud masks 14 are then removed by exposure to a wet etchant ($H_3PO_4$ at 165° C.) that does not appreciably attack either the surrounding oxide 16 or the underlying metal 12. After stud mask removal, note from FIG. 5 that the resulting vias will have a negative (i.e., undercut) profile. A second sputter etch (under conditions similar to those of the first sputter etch) is then carried out for a period of time sufficient to convert the negative sidewall slopes into positive sidewall slopes. Finally, a second layer of metal is deposited under conditions similar to the first metal layer. Because the vias to be filled are only one-half the depth of the vias of the prior art, and since the vias have positive sidewall slopes, the metal can be coated within the vias without producing voids. See FIG. 6. The second metal layer may then be patterned as desired.

Thus, the present invention minimizes both of the gap-fill and hole-fill problems by providing gaps and vias having smaller aspect ratios. The gap aspect ratio is reduced by tapering the sidewalls of stud mask. The via aspect ratio is reduced by reducing the via depth to be filled. The via aspect ratio is further reduced by tapering the via sidewalls.

Figure 7:
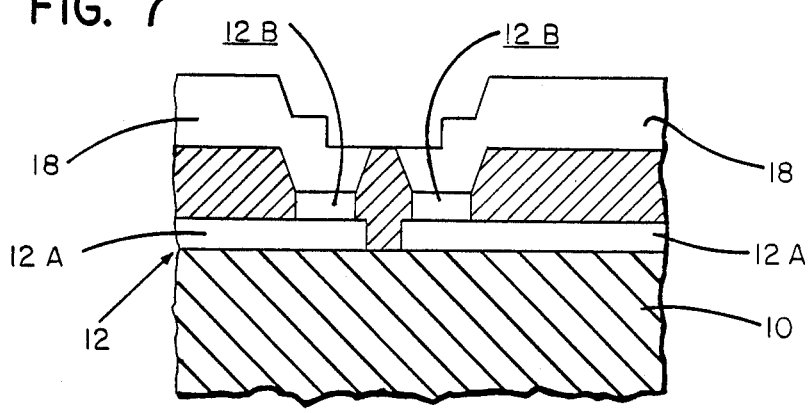
FIG. 7 is a cross-sectional view of a substrate that has undergone the process steps according to a second embodiment of the invention.

While the invention has been shown and described with reference to forming free-standing studs, the invention is not to be limited thereby. As shown in FIG. 7, the invention can also be carried out to define studs between metal layers. First metal layer 12 has a first portion 12a that provides a metal wiring plane and a second portion 12b that provides a partial "stud-up" which (in association with the partial "stud-down" defined by those portions of metal layer 18 lying within the vias) couples the first wiring plane 12a to the second wiring plane defined by the portions of metal layer 18 lying outside the filled vias.

Many modifications may be made to the structures and teachings as described above without departing from the spirit and scope of the present invention. For example, a sputter etch-stop material may be formed between the nitride stud mask and the underlying metal. Thus, when the sidewalls of the vias are sputter etched, the sputter etch-stop layer will protect the metal during the initial phase of the etch, and will be then removed at the final phase of the etch so as to not degrade metal contact.

We claim:

1. A method of forming a conductive structure on a substrate, comprising steps of:

forming masking structures having substantially vertical sidewalls on the substrate;

positively tapering said sidewalls of said masking structures;

defining an insulating layer on the substrate, said insulating layer exposing upper surfaces of said masking structures;

removing said masking structures to form vias in said insulating layer, said vias having negatively-sloping sidewalls;

positively tapering said sidewalls of said vias; and forming a conductive layer on said insulating layer, said conductive layer filling said vias to define the conductive structure.

2. The method as recited in claim 1, wherein said masking structures are comprised of silicon nitride.

3. The method as recited in claim 1, wherein both of said positively tapering steps are carried out by sputter etching.

4. The method as recited in claim 1, wherein said insulating layer is selected from the group consisting of undoped glass, BPSG, PSG, and polyimide.

5. The method as recited in claim 4, said insulator layer is polished after deposition in the presence of an abrasive slurry.

6. The method as recited in claim 1, wherein said step of removing said masking structures is carried out by exposure to a wet etchant.

7. The method as recited in claim 6, wherein said wet etchant comprises $H_3PO_4$.

8. A method of forming conductive studs on a substrate, comprising the steps of depositing a first conductive layer on the substrate;

defining stud masks having substantially vertical sidewalls on said first conductive layer;

patterning said first conductive layer through said stud masks, remaining portions of said first conductive layer beneath said stud masks partially defining the conductive studs;

etching said stud masks so that said sidewalls of said stud masks have a positive slope;

depositing an insulator layer on the substrate, said insulator layer covering said stud masks;

etching said insulator layer so as to expose upper surfaces of said stud masks;

removing said stud mask without appreciably attacking adjacent portions of said insulator layer, to define vias having negatively-sloping sidewalls in said insulator layer, said vias exposing said remaining portions of said first conductive layer; and etching said sidewalls of said vias to form positively-sloping sidewalls;

depositing a second conductive layer on said insulator layer, said second conductive layer filling said vias to define the conductive studs in combination with said remaining portions of said first conductive layer.

9. A method of forming a conductive structure on a substrate, comprising the steps of:

depositing a first conductive layer on the substrate;

patterning the first conductive layer to define a first wiring plane and a partial stud-up, said partial stud-up being covered by a stud mask;

etching said stud mask so that said sidewalls of said stud mask have a positive slope;

depositing an insulator layer on the substrate, said insulator layer covering said stud mask;

planarizing said insulator layer so as to expose upper surfaces of said stud mask;

removing said stud mask without appreciably attacking adjacent portions of said insulator layer to define a via that exposes said partial stud-up of said first conductive layer, said via having negatively-sloped sidewalls;

etching said adjacent portions of said side walls of said via to define a via having positively-sloping sidewalls; and depositing a second conductive layer on said insulator layer, said second conductive layer filling said via to form a partial stud-down that contacts said exposed stud-up of said first conductive layer.

* * * * *